(12) United States Patent
LV et al.

(10) Patent No.: US 10,720,578 B2
(45) Date of Patent: Jul. 21, 2020

(54) SELF-GATING RESISTIVE STORAGE DEVICE HAVING RESISTANCE TRANSITION LAYER IN VERTICAL TRENCH IN STACKED STRUCTURE OF INSULATING DIELECTRIC LAYERS AND ELECTRODES

(71) Applicant: THE INSTITUTE OF MICROELECTRONICS OF CHINESE ACADEMY OF SCIENCES, Beijing (CN)

(72) Inventors: Hangbing LV, Beijing (CN); Ming Liu, Beijing (CN); Xiaoxin Xu, Beijing (CN); Qing Luo, Beijing (CN); Qi Liu, Beijing (CN); Shibing Long, Beijing (CN)

(73) Assignee: THE INSTITUTE OF MICROELECTRONICS OF CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/070,485

(22) PCT Filed: Apr. 29, 2016

(86) PCT No.: PCT/CN2016/080659
§ 371 (c)(1),
(2) Date: Jul. 16, 2018

(87) PCT Pub. No.: WO2017/185326
PCT Pub. Date: Nov. 2, 2017

(65) Prior Publication Data
US 2019/0081237 A1     Mar. 14, 2019

(51) Int. Cl.
*H01L 45/00*     (2006.01)
*H01L 27/24*     (2006.01)

(52) U.S. Cl.
CPC ........ *H01L 45/1233* (2013.01); *H01L 27/249* (2013.01); *H01L 27/2463* (2013.01);
(Continued)

(58) Field of Classification Search
CPC ... H01L 45/142; H01L 45/143; H01L 45/146; H01L 27/2463; H01L 27/2481; H01L 27/249
See application file for complete search history.

(56) References Cited

U.S. PATENT DOCUMENTS

2013/0328005 A1* 12/2013 Shin .................... H01L 27/2436 257/1
2015/0255512 A1* 9/2015 Takagi .................. H01L 45/146 257/4

(Continued)

FOREIGN PATENT DOCUMENTS

CN     101409327 A     4/2009

*Primary Examiner* — Michael Jung
(74) *Attorney, Agent, or Firm* — Platinum Intellectual Property LLP

(57) ABSTRACT

Provided are a self-gating resistive storage device and a method for fabrication thereof; said self-gating resistive storage device comprises: lower electrodes; insulating dielectric layers arranged perpendicular to, and intersecting with, the lower electrodes to form a stacked structure, said stacked structure being provided with a vertical trench; a gating layer grown on the lower electrodes by means of self-alignment technique, the interlayer leakage channel running through the gating layer being isolated via the insulating dielectric layers; a resistance transition layer arranged in the vertical trench and connected to the insulating dielectric layers and the gating layer; and an upper electrode arranged in the resistance transition layer. In the storage device provided by the described technical solution, the gating layer is grown on the lower electrodes by means of self-alignment technique, such that the interlayer leakage (Continued)

channel running through the gating layer is isolated via the insulating dielectric layers; thus leakage between the upper and lower word lines through the gating layer is prevented, solving the technical problem in the prior art of leakage between the upper and lower word lines in a self-gating resistive storage device, and improving the reliability of the device.

6 Claims, 3 Drawing Sheets

(52) U.S. Cl.
CPC ...... *H01L 27/2481* (2013.01); *H01L 45/1253* (2013.01); *H01L 45/14* (2013.01); *H01L 45/142* (2013.01); *H01L 45/143* (2013.01); *H01L 45/1608* (2013.01); *H01L 45/1675* (2013.01); H01L 45/04 (2013.01); H01L 45/1226 (2013.01); H01L 45/146 (2013.01)

(56) References Cited

U.S. PATENT DOCUMENTS

| | | | |
|---|---|---|---|
| 2015/0333103 A1* | 11/2015 | Toh | H01L 45/06 257/5 |
| 2015/0340406 A1* | 11/2015 | Jo | H01L 45/141 29/604 |
| 2019/0066780 A1* | 2/2019 | Hu | G11C 11/56 |

* cited by examiner

SELF-GATING RESISTIVE STORAGE DEVICE HAVING RESISTANCE TRANSITION LAYER IN VERTICAL TRENCH IN STACKED STRUCTURE OF INSULATING DIELECTRIC LAYERS AND ELECTRODES

TECHNICAL FIELD

The present invention relates to the field of microelectronic technology, and particularly, relates to a self-gating resistive storage device and method for fabrication thereof.

BACKGROUND OF THE INVENTION

A resistive memory is of a metal/oxide/metal (MIM) capacitor structure. Under the action of electrical signals, the device is reversibly converted between a high resistance state (HRS) and a low resistance state (LRS) to realize a data storage function. The resistive memory has attracted great attention at home and abroad due to its excellent characteristics in terms of cell area, three-dimensional integration, low power consumption, high erasing speed, multi-value storage and the like.

There are mainly two three-dimensional integration methods for the resistive memory: one method adopts a cross array multilayer stacked structure, that is, a two-dimensional cross array structure is repeatedly fabricated and stacked in multiple layers; and the other method adopts a vertical cross array structure, in which the traditional horizontal cross array structure is rotated 90 degrees and repeatedly extended in the horizontal direction to form a three-dimensional array of a vertical structure. Compared with the multilayer stacked structure, the unit in the vertical direction of the three-dimensional array of the vertical structure is formed by filling a trench once, thus greatly saving an expensive lithography step. Although the fabrication cost of the vertical cross array structure is low, the problem that gating tubes are difficult to integrate is caused because of the absence of a patterning process for a single device, so it is the key of constructing the vertical cross array to develop a resistive device with a self-gating function.

The self-gating resistive device usually has a double-layer structure and combines a gating functional layer and a resistive functional layer. As shown in FIG. 1, it is a common practice to successively deposit a gating layer 501 and a resistive layer 601 in a trench to form an edge contact self-gating storage unit with lower electrodes 301-303 (i.e., word lines) stacked in multiple layers. By means of this method, the problem of read and write crosstalk in a vertical cross array can be solved. However, since the upper and lower word lines are connected through the gating layer, there is a problem of interlayer leakage. Because the transition voltage of the gating layer is proportional to the thickness, when the size of the array continues to shrink, the interlayer leakage phenomenon will become more prominent. Please refer to FIG. 2, which is a read/write schematic diagram of the vertical cross array. During read/write, a voltage difference V/2 (taking V/2 bias as an example) exists between upper and lower word lines. When the interlayer voltage difference approaches or exceeds the transition voltage of the gating layer 501, high leakage occurs between the upper and lower word lines, resulting in the problem of reliability of the device.

SUMMARY OF THE INVENTION

The embodiments of the present invention provide a resistive storage device and a method for fabrication thereof, which are used for solving the technical problem of leakage between upper and lower word lines of a self-gating resistive storage device in the prior art, and improving the reliability of the device.

An embodiment of the present application provides a self-gating resistive storage device, including:
  lower electrodes;
  insulating dielectric layers, arranged perpendicular to, and intersecting with, the lower electrodes to form a stacked structure, said stacked structure being provided with a vertical trench;
  a gating layer grown on the lower electrodes by means of self-alignment technique, the interlayer leakage channel running through the gating layer being isolated via the insulating dielectric layers;
  a resistance transition layer arranged in the vertical trench and connected to the insulating dielectric layers and the gating layer; and
  an upper electrode arranged in the resistance transition layer.

Optionally, the resistive storage device has a non-linear characteristic in low resistance state.

Optionally, the lower electrodes are made of one of the following materials or an alloy composed of at least two of the materials:
  W, Al, Cu, Ru, Ti, Ta, Co, Mo, Ir, Ni, Nb, TiN, TaN, IrO2, CuAl, CuTe and Cu$_3$Ge.

Optionally, the gating layer is made of one of the following oxides: tungsten oxide, titanium oxide, copper oxide, tantalum oxide, cobalt oxide, molybdenum oxide, niobium oxide, nickel oxide and iridium oxide.

Optionally, the thicknesses of the lower electrodes and/or the upper electrode are 1 nm to 100 nm.

Optionally, the resistance transition layer is made of:
  one of CuS, AgS, AgGeSe, CuIxSy, ZrO2, HfO2, TiO2, SiO2, WOx, NiO, CuOx, ZnO, TaOx, CoO, Y2O3, Si, PCMO, SZO, STO and organic materials or a material formed after one of the materials is doped and modified.

Optionally, the thickness of the resistance transition layer is 1 nm to 100 nm.

Optionally, the upper electrode is made of one of the following materials or an alloy composed of at least two of the materials:
  W, Al, Cu, Au, Ag, Pt, Ru, Ti, Ta, Pb, Co, Mo, Ir, Ni, TiN, TaN, IrO2, CuTe and Cu3Ge.

An embodiment of the present application provides a method for fabricating the self-gating resistive storage device, including the steps of:
  forming a stacked structure of at least two lower electrodes on a substrate, the lower electrodes being isolated via insulating dielectric layers, the lower electrodes being isolated from the substrate by the insulating dielectric layers, and the lower electrodes being word lines of a vertical cross array structure;
  forming a vertical trench by etching in the stacked structure;
  forming a gating layer on the lower electrodes in the vertical trench by means of self-alignment, the interlayer leakage channel running through the gating layer being isolated via the insulating dielectric layers;
  depositing a resistance transition layer on the gating layer and the insulating dielectric layers;
  depositing an upper electrode on the resistance transition layer, and flattening the upper electrode to form a bit line of the vertical cross array structure.

Optionally, the step of forming a gating layer on the lower electrodes in the vertical trench by means of self-alignment includes: oxidizing part of the materials on the lower electrodes into the gating layer in an oxygen-containing atmosphere through thermal oxidation or plasma oxidation.

Optionally, the thickness of the gating layer is 3 nm to 30 nm.

Optionally, the thicknesses of the lower electrodes and/or the upper electrode are 1 nm to 100 nm.

Optionally, when the lower electrodes are made of metal, the lower electrodes are deposited by one of electron beam evaporation, chemical vapor deposition, pulsed laser deposition, atomic layer deposition, magnetron sputtering and electroplating.

Optionally, the step of depositing a resistance transition layer on the gating layer and the insulating dielectric layers includes:

depositing the resistance transition layer on the gating layer and the insulating dielectric layers by adopting one of electron beam evaporation, chemical vapor deposition, pulsed laser deposition, atomic layer deposition, spin coating and magnetron sputtering.

Optionally, the step of depositing an upper electrode on the resistance transition layer includes:

depositing the upper electrode on the resistance transition layer by adopting one of electron beam evaporation, chemical vapor deposition, pulsed laser deposition, atomic layer deposition, magnetron sputtering and electroplating.

One or more of the foregoing technical solutions in the embodiments of the present application at least have the following technical effects:

The gating layer is grown on the lower electrodes by means of self-alignment technique, such that the interlayer leakage channel running through the gating layer is isolated via the insulating dielectric layers; thus leakage of the upper and lower word lines by means of the gating layer is prevented, solving the technical problem in the prior art of leakage between the upper and lower word lines in a self-gating resistive storage device, and improving the reliability of the device.

BRIEF DESCRIPTION OF THE DRAWINGS

Various other advantages and benefits will become apparent to those of ordinary skill in the art by reading the detailed description of preferred embodiments below. The drawings are only for illustrating the preferred embodiments and are not contemplated as limit to the present invention. In addition, same reference signs indicate same components throughout the drawings, in which.

DETAILED DESCRIPTION OF THE INVENTION

Figure 1:
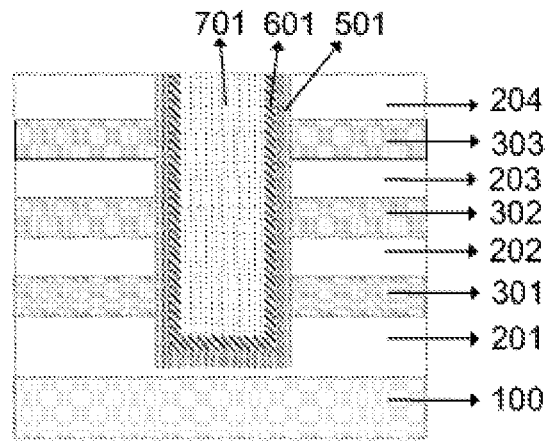
FIG. 1 is a structure diagram of a self-gating resistive memory in the prior art.
Figure 2:
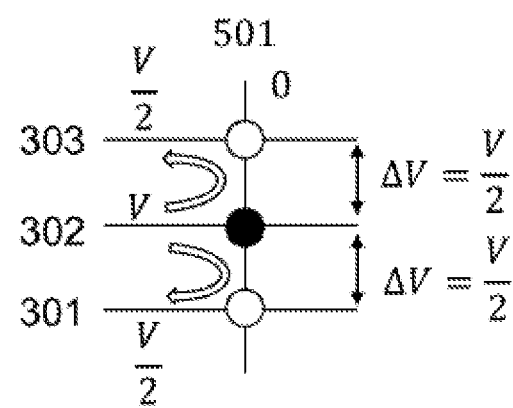
FIG. 2 is a read/write schematic diagram of a vertical cross array in the prior art.

Exemplary embodiments of the present disclosure will be described in more detail below with reference to the accompanying drawings. Although the drawings show the exemplary embodiments of the present disclosure, it should be understood that the present disclosure may be implemented in various forms and should not be limited to the embodiments illustrated herein. On the contrary, these embodiments are provided so that the present disclosure can be understood more thoroughly, and can fully convey the scope of the present disclosure to those skilled in the art.

The present invention will be described more fully hereinafter in reference embodiments in combination with the drawings, and the present invention provides preferred embodiments, but should not be regarded as being limited to the embodiments described herein. In the figures, the thicknesses of layers and regions are magnified for clarity, but the schematic diagrams should not be considered to strictly reflect the proportional relationship of the geometric dimensions. The reference drawings herein are schematic diagrams of idealized embodiments of the present invention. The illustrated embodiments of the present invention should not be regarded as being limited to the specific shapes of the regions shown in the drawings, but include any obtained shape. The shapes in the drawings are schematic, but the scope of the present invention is not limited thereto.

Embodiments

An embodiment of the present application provides a self-gating resistive storage device, including:

lower electrodes;

insulating dielectric layers, arranged perpendicular to, and intersecting with, the lower electrodes to form a stacked structure, said stacked structure being provided with a vertical trench;

a gating layer grown on the lower electrodes by means of self-alignment technique, the interlayer leakage channel running through the gating layer being isolated via the insulating dielectric layers;

a resistance transition layer arranged in the vertical trench and connected to the insulating dielectric layers and the gating layer; and an upper electrode arranged in the resistance transition layer.

The self-gating resistive storage device provided by the embodiment of the present application will be illustrated below taking three conductive lower electrodes as an example. However, the present invention does not limit the number of the conductive lower electrodes, which may also be 4, 5, 6, etc.

Figure 3:
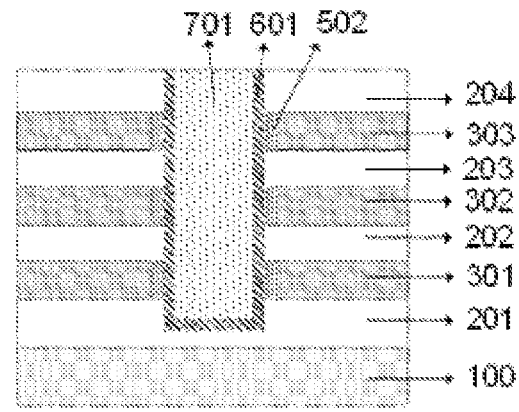
FIG. 3 is a structure diagram of a self-gating resistive storage device according to an embodiment of the present application.

Referring to FIG. 3, which is a structure diagram of the self-gating resistive storage device according to an embodiment of the present application, three conductive lower electrodes 301, 302 and 303 and four insulating dielectric layers 201, 202, 203 and 204 are adopted, and the lower electrodes are intersected with the insulating dielectric layers to form a vertical cross array structure. Specifically, the lower electrode 301 is isolated from a substrate 100 via the insulating dielectric layer 201, the lower electrodes 301 and 302 are isolated via the insulating dielectric layer 202, the lower electrodes 302 and 303 are isolated via the insulating dielectric layer 203, and the insulating dielectric layer 204 covers the lower electrode 303.

The lower electrodes may be made of one of the following materials or an alloy composed of at least two of the materials: W, Al, Cu, Ru, Ti, Ta, Co, Mo, Ir, Ni, Nb, TiN, TaN, IrO2, CuAl, CuTe and Cu$_3$Ge, and the thicknesses of the lower electrodes are 1 nm to 100 nm, e.g., 1 nm, 5 nm, 50 nm, 80 nm or 100 nm. As a preferred solution, the Ti lower electrodes are formed by sputtering in this embodiment, and have the thicknesses of 3 nm to 100 nm. The insulating dielectric layers may be made of SiN, SiO, SiON, SiO$_2$, C-doped SiO$_2$, P-doped SiO$_2$ or F-doped SiO$_2$, etc., and are formed by chemical vapor deposition or sputtering. As a preferred solution, in this embodiment, the insulating dielectric layers are SiO$_2$, are formed by chemical vapor deposition and have the thicknesses of 3 nm to 100 nm, e.g., 3 nm, 5 nm, 50 nm, 80 nm or 100 nm.

The gating layer 502 is grown on the lower electrodes by means of self-alignment technique, and the gating layer is isolated via the insulating dielectric layers, i.e., the interlayer leakage channel running through the gating layer is isolated via the insulating dielectric layers. The thickness of the gating layer 502 is 1 nm to 100 nm. The gating layer 502 may be made of one of the following oxides: tungsten oxide, titanium oxide, copper oxide, tantalum oxide, cobalt oxide, molybdenum oxide, niobium oxide, nickel oxide and iridium oxide. As a preferred embodiment, the gating layer 502 is made of a titanium oxide, and has the thickness of 3 nm to 30 nm, e.g., 3 nm, 5 nm, 20 nm or 30 nm.

The resistance transition layer 601 is arranged in the vertical trench of the vertical cross array structure formed by the lower electrodes and the insulating dielectric layers, and is connected to the insulating dielectric layers and the gating layer 502. The resistance transition layer 601 may be made of one of the following materials or a material formed after one of the materials is doped and modified: CuS, AgS, AgGeSe, CuIxSy, ZrO2, HfO2, TiO2, SiO2, WOx, NiO, CuOx, ZnO, TaOx, CoO, Y2O3, Si, PCMO, SZO, STO and organic materials. The thickness of the resistance transition layer 601 is 1 nm to 100 nm, e.g., 1 nm, 5 nm, 50 nm, 80 nm or 100 nm.

The upper electrode 701 is arranged in the resistance transition layer 601. The upper electrode 701 may be made of one of the following materials or an alloy composed of at least two of the materials: W, Al, Cu, Au, Ag, Pt, Ru, Ti, Ta, Pb, Co, Mo, Ir, Ni, TiN, TaN, IrO2, CuTe and Cu3Ge. The thickness of the upper electrode 701 may be 1 nm to 100 nm, e.g., 1 nm, 5 nm, 50 nm, 80 nm or 100 nm. It should be noted that the embodiment of the present application does not limit the shapes of the electrodes.

According to the self-gating resistive storage device provided by the above embodiment, an embodiment of the present application also correspondingly provides a method for fabricating the self-gating resistive storage device, including:

Step 1: forming a stacked structure of at least two lower electrodes on a substrate, the lower electrodes being isolated via insulating dielectric layers, the lower electrodes being isolated from the substrate by the insulating dielectric layers, and the lower electrodes being word lines of a vertical cross array structure;

Step 2: forming a vertical trench 401 by etching in the stacked structure;

Step 3: forming a gating layer 502 on the lower electrodes in the vertical trench 401 by means of self-alignment, the interlayer leakage channel running through the gating layer 502 being isolated via the insulating dielectric layers;

Step 4: depositing a resistance transition layer 601 on the gating layer 502 and the insulating dielectric layers; and Step 5: depositing an upper electrode 701 on the resistance transition layer 601, and flattening the upper electrode to form a bit line of the vertical cross array structure.

Figure 4:
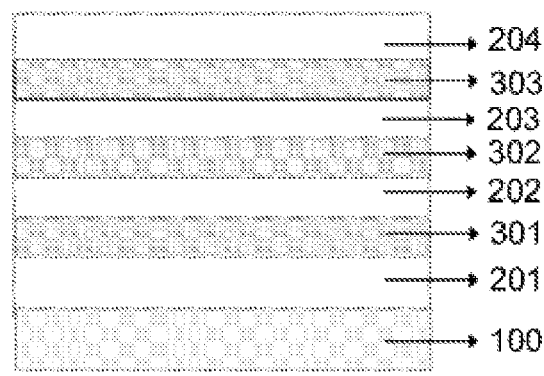
FIG. 4 is a schematic diagram of fabricating a vertical cross array structure according to an embodiment of the present application.

In step 1, a plurality of patterned conductive lower electrode layers may be deposited on the substrate. As shown in FIG. 4, a stacked structure of a plurality of conductive lower electrodes is formed on the Si substrate 100. The conductive lower electrodes serve as word lines in the vertical cross array structure and are isolated via insulating dielectric layers. As a preferred solution, a stacked structure of three lower conductive lower electrodes 301, 302 and 303 is adopted in this embodiment, and the number of stacked layers is not limited by the present invention. As shown in FIG. 4, the lower electrode 301 is isolated from the substrate 100 via the insulating dielectric layer 201, the lower electrodes 301 and 302 are isolated via the insulating dielectric layer 202, the lower electrodes 302 and 303 are isolated via the insulating dielectric layer 203, and the insulating dielectric layer 204 covers the lower electrode 303. The lower electrodes may be formed by chemical plating, magnetron sputtering or chemical vapor deposition, or formed by pulsed laser, atomic layer deposition or electron beam evaporation. The embodiments of the present application do not limit the specific forming method of the lower electrodes. When the lower electrodes are made of metal, the lower electrodes may be deposited by one of electron beam evaporation, chemical vapor deposition, pulsed laser deposition, atomic layer deposition, electroplating and magnetron sputtering. As a preferred solution, the Ti lower electrodes are formed by sputtering in this embodiment, and have the thicknesses of 3 nm to 100 nm. The thicknesses of the lower electrodes specifically may be any of 3 nm to 100 nm, e.g., 3 nm, 5 nm, 50 nm, 80 nm or 100 nm. The insulating dielectric layers 201, 202, 203 and 204 may be made of SiN, SiO, SiON, SiO2, C-doped SiO2, P-doped SiO2 or F-doped SiO2, etc., and are formed by chemical vapor deposition or sputtering. As a preferred solution, the dielectric layers 201, 202, 203 and 204 in this embodiment are made of SiO2 and formed by chemical vapor deposition, and have the thicknesses of 3 nm to 100 nm. The specific thicknesses of the dielectric layers 201, 202, 203 and 204 may be any of 3 nm to 100 nm, e.g., 3 nm, 5 nm, 50 nm, 80 nm or 100 nm.

Figure 5:
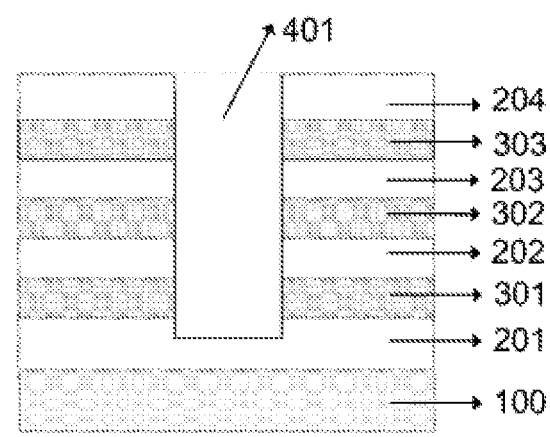
FIG. 5 is a schematic diagram of fabricating a trench of the self-gating resistive storage device according to an embodiment of the present application.

In step 2, the vertical trench is formed by etching. As shown in FIG. 5, the vertical trench 401 is formed by photolithography and etching. In this step, the photolithography may be a pattern transfer technique such as conventional photolithography, electron beam exposure, nano-imprint, etc.; the etching may be dry etching or wet etching; because the etching involves multiple layers of thin films, a single-step etching process may be adopted to form the trench at a single time, or a multi-step etching process is adopted to etch dielectrics and metals separately.

Figure 6:
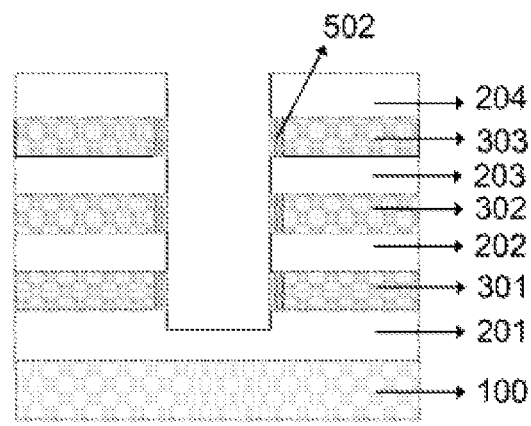
FIG. 6 is a schematic diagram of fabricating a gating layer of the self-gating resistive storage device according to an embodiment of the present application.

In step 3, the gating layer 502 is formed on the multiple exposed lower electrodes in the trench 401 in the oxygen-containing atmosphere such as oxygen, water vapor or ozone through thermal oxidation or plasma oxidation by means of self-alignment, as shown in FIG. 6. The self-alignment, i.e., self-alignment technique, is a technique that realizes optical printing automatic alignment using the characteristics of component or device structures in microelectronic technique. As a preferred embodiment, the gating layer 502 may be made of a titanium oxide, and has the thickness of 3 nm to 30 nm, e.g., 3 nm, 5 nm, 10 nm or 20 nm.

Figure 7:
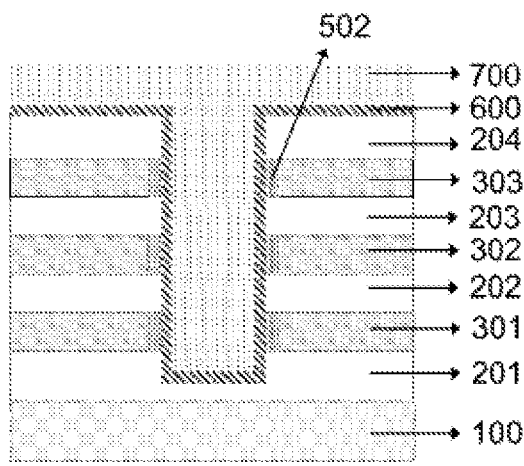
FIG. 7 is a schematic diagram of fabricating a resistance transition layer and an upper electrode according to an embodiment of the present application.

In step 4, a resistance transition layer 600 is deposited in the trench 401 and on the gating layer 501. As shown in FIG. 7, as a preferred embodiment, the resistance transition layer 600 may be made of Ta2O5 or HfO2, and is fabricated by sputtering or atomic vapor deposition. The thickness of the resistance transition layer 600 is 1 nm to 30 nm, e.g., 3 nm, 5 nm, 10 nm, 20 nm or 30 nm. The resistance transition layer 600 may be deposited by one of electron beam evaporation, chemical vapor deposition, pulsed laser deposition, atomic layer deposition, spin coating and magnetron sputtering.

In step 5, an upper electrode 700 is deposited in the trench 401 and on the resistance transition layer 600, as shown in FIG. 7. As a preferred embodiment, the upper electrode 700 may be made of one of Ti, TiN, Ta, TaN, Ru and Cu or be a multi-layer composite electrode of them, and may be fabricated by one of electron beam evaporation, chemical vapor deposition, pulsed laser deposition, atomic layer deposition, magnetron sputtering and electroplating. The thickness of the upper electrode 700 may be 1 nm to 100 nm, e.g., 1 nm, 3 nm, 10 nm, 50 nm, 80 nm or 100 nm. After the upper electrode 700 is formed, the upper electrode 700 is flattened to form a bit line of the vertical cross array structure. Further, the horizontal portions of the upper electrode 700 and the resistance transition layer 600 are removed by chemical mechanical polishing to complete patterning of the bit line and form the upper electrode 701 and the resistance transition layer 601, as shown in FIG. 3.

Heretofore, a vertical cross array structure of a resistive memory with self-alignment and self-gating functions as shown in FIG. 3 is fabricated.

Figure 8:
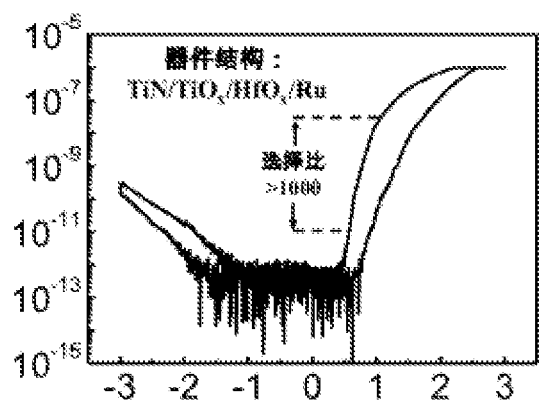
FIG. 8 is a current-voltage test diagram of the self-gating resistive storage device according to an embodiment of the present application.

Referring to FIG. 8, which is a current-voltage test diagram of the self-alignment and self-gating resistive storage device according to an embodiment of the present application, the low resistance state of the device has an obvious non-linear characteristic. The gating layer is grown on the lower electrodes by means of self-alignment technique, such that the interlayer leakage channel running through the gating layer is isolated via the insulating dielectric layers; thus leakage of the upper and lower word lines by means of the gating layer is prevented, solving the technical problem in the prior art of leakage between the upper and lower word lines in a self-gating resistive storage device, and improving the reliability of the device.

Many embodiments with great differences may be constituted without departing from the spirit and scope of the present invention. It should be understood that the present invention is not limited to the specific embodiments described in the specification except as defined by the appended claims.

What is claimed is:

1. A self-gating resistive storage device, comprising:
a substrate on a bottom side of the self-gating resistive storage device;
a plurality of lower electrodes;
a plurality of insulating dielectric layers, each of the plurality of insulating dielectric layers interposed between each of the plurality of lower electrodes to form a stacked structure on the substrate;
a vertical trench arranged in the stacked structure, the vertical trench extending from a top of the stacked structure to a portion of a first insulating dielectric layer of the plurality of insulating dielectric layers, the first insulating dielectric layer of the plurality of insulating dielectric layers configured to isolate a first lower electrode of the plurality of lower electrodes from the substrate, wherein a bottom of the vertical trench does not reach the substrate;
a gating layer coupled with the plurality of lower electrodes, the gate layer being isolated via the plurality of insulating dielectric layers;
a resistance transition layer arranged in the vertical trench and connected to the plurality of insulating dielectric layers and the gating layer; and
an upper electrode arranged in the resistance transition layer,
wherein the lower electrodes are made of one of the following materials or an alloy composed of at least two of the materials: W, Cu, Ru, Ti, Co, Mo, Ir, Nb, TiN, TaN, IrO$_2$, CuAl, CuTe and Cu$_3$Ge; and
wherein the resistance transition layer is made of one of CuS, AgS, AgGeSe, CulxSy, SiO$_2$,WOx, NiO, CuOx, ZnO, CoO, Y$_2$O$_3$, Si, PrCaMnO (PCMO), strontium titanate (STO).

2. The self-gating resistive storage device according to claim 1, wherein the resistive storage device has a non-linear characteristic in low resistance state.

3. The self-gating resistive storage device according to claim 1, wherein the gating layer is made of one of the following oxides: tungsten oxide, titanium oxide, copper oxide, tantalum oxide, cobalt oxide, molybdenum oxide, niobium oxide, nickel oxide and iridium oxide.

4. The self-gating resistive storage device according to claim 1, wherein the thicknesses of the lower electrodes and/or the upper electrode are 1 nm to 100 nm.

5. The self-gating resistive storage device according to claim 1, wherein the thickness of the resistance transition layer is 1 nm to 100 nm.

6. The self-gating resistive storage device according to claim 1, wherein the upper electrode is made of one of the following materials or an alloy composed of at least two of the materials: W, Al, Cu, Au, Ag, Pt, Ru, Ti, Ta, Pb, Co, Mo, Ir, Ni, TiN, TaN, IrO$_2$, CuTe and Cu$_3$Ge.

* * * * *